United States Patent [19]
Green

[11] Patent Number: 5,488,554
[45] Date of Patent: Jan. 30, 1996

[54] LOW-LOSS CLAMP CIRCUIT

[75] Inventor: Thomas W. Green, Rushford, N.Y.

[73] Assignee: Acme Electric Corporation, East Aurora, N.Y.

[21] Appl. No.: 294,440

[22] Filed: Aug. 23, 1994

[51] Int. Cl.⁶ .......................... H02H 7/122; H02M 3/337
[52] U.S. Cl. ................................ 363/25; 363/56; 363/24; 363/134
[58] Field of Search ....................... 363/24, 25, 53, 363/126, 48, 56, 97–98, 131–134, 136–137, 132; 323/351, 282; 361/11, 58, 111, 118

[56] References Cited

U.S. PATENT DOCUMENTS

| | | | |
|---|---|---|---|
| 3,257,604 | 6/1966 | Colclaser et al. | 321/45 |
| 3,297,960 | 1/1967 | Massey | 331/173 |
| 3,351,840 | 11/1967 | Yearley | 321/45 |
| 3,846,691 | 11/1974 | Higgins | 321/2 |
| 4,276,588 | 6/1981 | McLyman et al. | 363/56 |
| 4,542,440 | 9/1985 | Chetty et al. | 361/111 |
| 4,607,322 | 8/1986 | Henderson | 363/56 |
| 4,675,796 | 6/1987 | Gautherin et al. | 363/20 |
| 4,694,387 | 9/1987 | Walker | 363/56 |
| 4,706,181 | 11/1987 | Mercer | 363/56 |
| 4,736,284 | 4/1988 | Yamagishi et al. | 363/16 |
| 4,876,635 | 10/1989 | Park et al. | 363/17 |
| 5,075,838 | 12/1991 | Schnetzka et al. | 363/53 |
| 5,130,917 | 4/1992 | Shekhawat | 363/56 |
| 5,148,358 | 9/1992 | Estes, Jr. | 363/37 |

OTHER PUBLICATIONS

"Single-stage current-fed dc/dc converter with time sharing control of output voltage and input current." Paolo Tentj et al. IEEE document CH7721-9/89/0000-0548 (1989) pp. 548-555.

"Considerations on the relationship between distributed capacitance and power loss in a push–pull current–fed converter in buck–mode." Satoshi Ohtsu et al. IEEE document CH2523-9/88/0000-1007 (1988) pp. 1007-1012.

"Push–pull current–fed multiple-output regulated wide–input–range dc/dc power converter with only one inductor and with 0 to 100% switch duty ratio: operation at duty ratio below 50%." Dr. Richard Redl et al. IEEE document CH1652-7/81/0000-0204 (1981) pp. 204-212.

"Analysis and design of a push–pull current–fed converter." Thomas G. Wilson et al. IEEE document CH1652-7/81/0000-0192 (1981) pp. 192-203.

"A current–sourced dc–dc converter derived via the duality principle from the half–bridge converter." Peter J. Wolfs. IEEE document 0278-0046/93 (1993) pp. 139-144.

Primary Examiner—Peter S. Wong
Assistant Examiner—Aditya Krishnan
Attorney, Agent, or Firm—Pearne, Gordon, McCoy & Granger

[57] ABSTRACT

A low loss clamp circuit is provided for a dc to dc converter. The converter has a transformer with a secondary winding and a secondary circuit and a center tap primary winding. A dc voltage input is supplied to the primary winding center tap and to a circuit ground. A rectifier such as a bridge rectifier connects to two ends of the secondary winding and to the circuit ground to supply a dc output voltage. A pair of semiconductor switches such as FET switches are provided. Each end of the primary winding is connected through a respective switch to the common ground. The various circuits have energy storage means including the input capacitor 31 and input choke 32 in circuit with the primary winding. It will also be noted that the output capacitor 29 is a part of the energy storage means. This energy storage means is connected to return energy to the secondary circuit, not the primary circuit.

15 Claims, 9 Drawing Sheets

LOW-LOSS CLAMP CIRCUIT

BACKGROUND OF THE INVENTION

Clamp circuits have been used in a number of prior art circuits. They may also be considered snubber circuits which limit a voltage across a circuit element. In DC to DC converter circuits, semi-conductor switches are used to control the flow of energy. When the switch is opened an inductance is in the circuit, such as a transformer primary, a high voltage is generated across the switch as it turns off. The prior art clamp circuits have in some cases used a capacitor in circuit across the semi-conductor switch, perhaps with a diode in circuit therewith but also a resistor feeding power back to the input voltage source. This resistor dissipates energy rather than positively utilizing that energy.

The U.S. Pat. No. 3,297,960 to Massey, shows a converter which uses a pair of diodes 1 and 2 to prevent saturation of a transistor 3 by maintaining a near zero voltage across the base and collector. The diodes are connected directly to the secondary of the power transformer to provide current and voltage feedback. Massey does not show the energy storage configuration of the present invention.

SUMMARY OF THE INVENTION

The invention relates to a low-loss clamp circuit for a converter. Specifically, this may be a DC to DC converter which is current fed. A push pull converter is shown with two semi-conductor switches, and when one of these two switches opens, the voltage thereacross is clamped to the voltage of a clamp capacitor, and the energy across this capacitor is returned to the secondary circuit of a transformer so that the circuit has very low loss.

Accordingly, an object of the invention is to provide a clamp circuit for a converter wherein energy of the clamp circuit is not lost in a resistance connected to the primary winding to a transformer. Instead it is fed into the secondary circuit which supplies a load voltage.

More specifically, the invention is directed to a low loss clamp circuit for a DC to DC converter. The converter including a transformer with a secondary winding in a secondary circuit and center tapped primary winding, the primary winding center tap and a circuit ground being energizable by a DC voltage input, a rectifier connected to the secondary winding and to the circuit ground to supply a DC output voltage, a pair of semiconductor switches each having input and output electrodes, each end of the primary winding being connected through a respective switch to circuit ground; each switch having a control electrode connected to a control circuit, said clamp circuit comprising: a pair of diodes connected cathode-to-cathode across the input electrodes of the switches at a clamp junction; a clamp capacitor connected between said clamp junction and said circuit ground and; energy return means connected to said clamp junction to return energy from said clamp capacitor to said secondary circuit.

Other objects and a fuller understanding of the invention may be had by referring to the following description and claims, taken in conjunction with the accompanying drawings.

DESCRIPTION OF THE PREFERRED EMBODIMENTS

Figure 1:
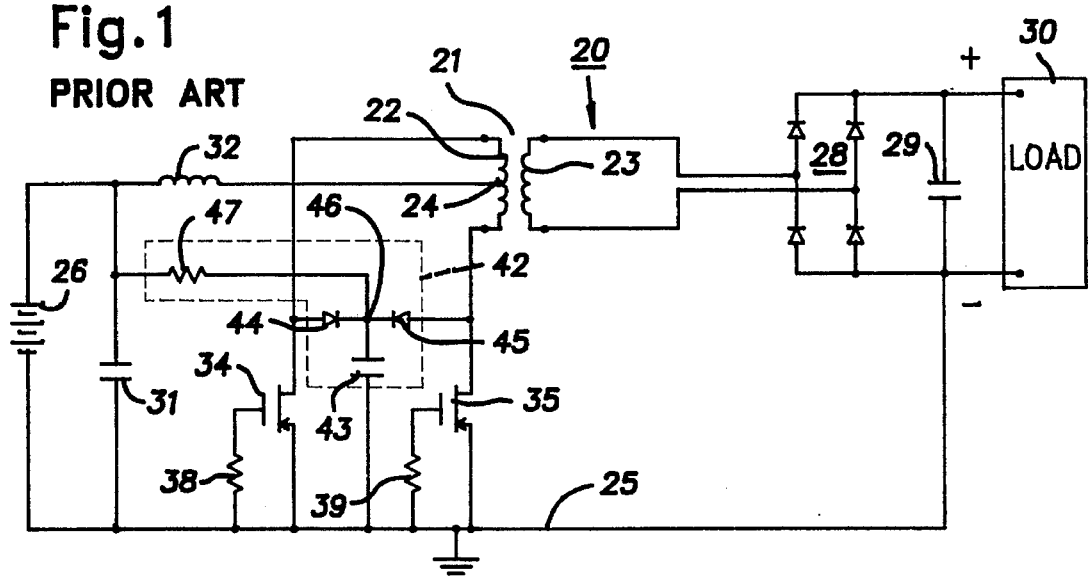
FIG. 1 is a schematic drawing of a prior art clamp circuit which dissipates energy.

FIG. 1 illustrates a prior art clamp circuit which dissipates energy. FIG. 1 illustrates a converter circuit which converts energy from one form into another form. In this case, the converter is a current fed DC to DC converter 20 which converts a low input DC voltage to a higher output DC voltage. This is accomplished by a transformer 21 which has a center tapped primary winding 22 and a secondary winding 23. The primary winding center tap 24 and a common circuit ground 25 are energized from a DC voltage source 26. The two ends of the secondary winding are connected to a rectifier 28, in this case a bridge rectifier with a filter capacitor 29 connected across the rectifier for smoothing of the output voltage which then is connected to a load 30. A smoothing capacitor 31 is connected across the input voltage, and a series choke 32 is connected between the positive end of the voltage input and the center tap 24. Semiconductor switches 34 and 35 are connected in push-pull to the ends of the primary winding 22. These semi-conductor switches may be bipolar transistors, gate turn-off thyristors, or as shown, may be field effect transistors. The two power electrodes of the switches are connected between the ends of the transformer primary winding and the common ground 25. With the FET's as shown, the drains are connected to the primary winding and the sources are connected to the ground 25. Gate drive resistors 38 and 39 are connected between the respective gates and ground.

A clamp circuit 42 clamps the voltage of the switches 34 and 35 to the DC voltage of a clamp capacitor 43. Clamp diodes 44 and 45 conduct current when the voltage across the respective switch exceeds the clamp voltage on the clamp capacitor 43. A clamp junction 46 is at the connection 43 to the cathodes of the clamp diodes. From this clamp junction, a clamp resistor 47 is connected to the primary circuit, in this case, the positive terminal of the input voltage. The disadvantage of this prior art circuit is that the clamp resistor 47 dissipates energy which lowers the efficiency of the converter.

Figure 2:
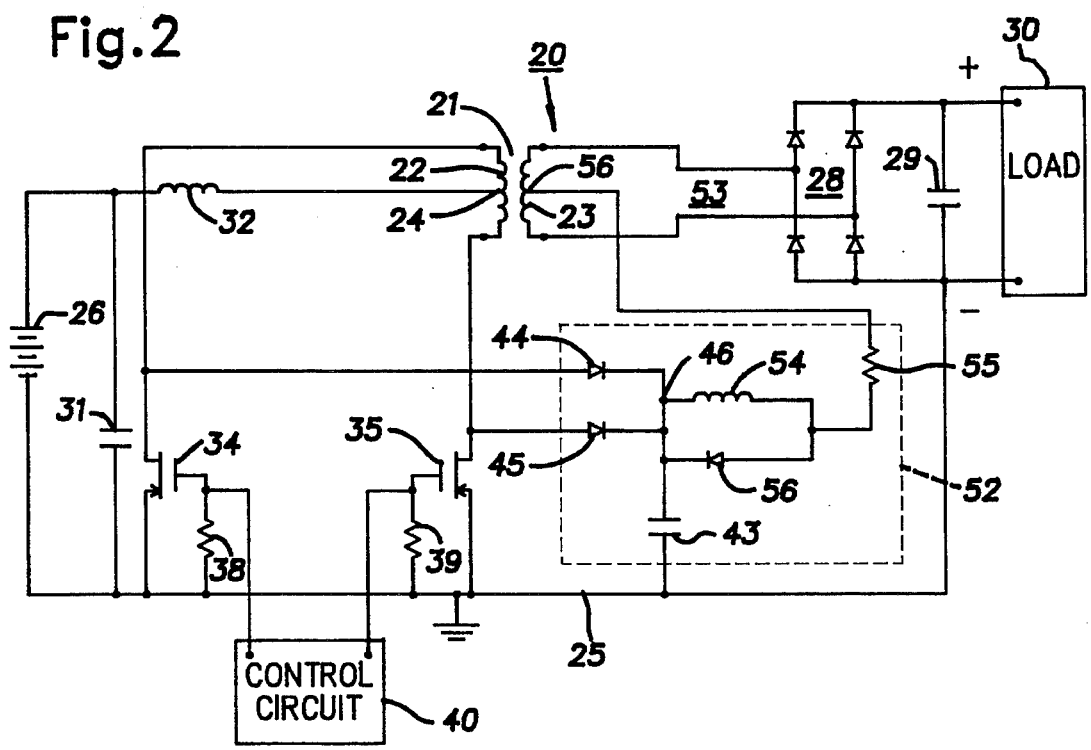
FIG. 2 is a schematic diagram of a clamp circuit which is a low loss circuit according to the invention.

FIG. 2 is a schematic diagram of a clamp circuit for a converter according to the invention. For convenience, the converter itself is the same as described for the prior art of FIG. 1, the clamp circuit 52 is, however, different. Also in this converter 20, a control circuit 40 has been added to supply the gate voltages. In the clamp circuit, the clamp diodes 44 and 45 are again connected together at the cathodes at a clamp junction 46. The clamp capacitor 43 is again connected between the clamp junction 46 and the common ground 25. The energy stored in the clamp capacitor 43, however, is connected to return energy to the secondary circuit 53 through an inductance 54 and a resistor 55 to a center tap 56 on the secondary winding 23. A protective diode 56 is connected across the inductance 54 with the cathode connected to the cathode junction 46. In this case, the energy is returned to the secondary circuit for a low loss clamp circuit which eliminates the loss in the prior art circuit and, thus, makes a more efficient converter.

Figure 3:
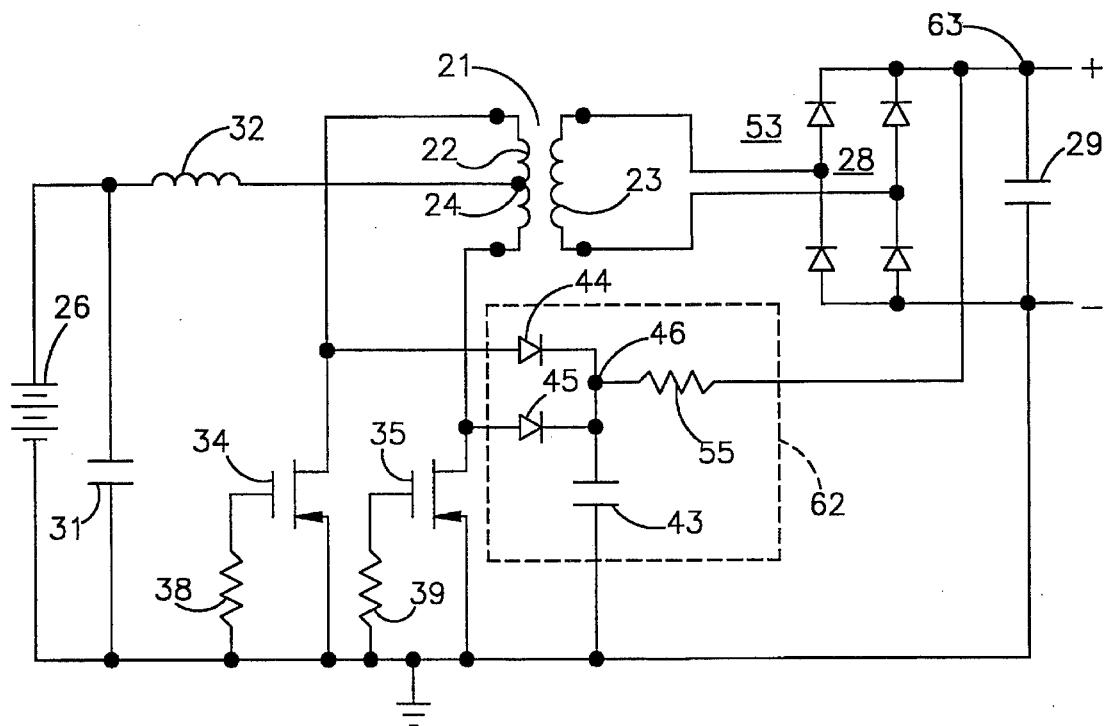
FIG. 3 is a modification of the invention.

FIG. 3 shows schematically another clamp circuit 62. This has the clamp diodes 44 and 45 and the clamp junction 46 with the clamp resistor 55 connected between the clamp junction 46 and the positive output voltage terminal 63. In this case, the energy from the clamp capacitor 43 is returned to the secondary circuit at the output voltage terminal. Assuming that the transformer is a step-up transformer, this clamps the voltage across the switches 34 and 35 to the output voltage rather than to the center tap of the secondary. This has the advantage of not requiring a center tapped secondary but has a disadvantage of clamping the voltage across the switches at a higher voltage.

The basic operation of the main circuit of FIG. 2 requires that both switches 34 and 35 be on together for a certain amount of time. Then only one of the two switches is turned off. During this off time current flowing in the 30 input inductor 32 flows through ½ the primary of the transformer and induces current to flow in the secondary. The secondary current then passes through the rectifier bridge 28 and to the output load.

When switches 34 or 35 turn off, the voltage across these devices will increase rapidly until they reach the steady state voltage of the clamp capacitor 43, e.g. 200 V. When this happens clamp diodes 44 and/or 45 will conduct and thereby set the maximum voltage of the switches to the clamp capacitor voltage. The voltage across the switches will remain clamped until the current in the transformer winding connected to the off switch decays to zero. The time it takes for the current to decay to zero is relatively short compared to the time duration of one cycle. As the transformer current is decaying to zero, it flows through one of the clamp diodes 44 or 45. The current then flows into the clamp capacitor 43 which increases the charge and energy level of this capacitor. This increased charge and associated energy is removed from the clamp capacitor when only one of the two switches 34 or 35 is on and the other one is off. During this time the transformer secondary winding 23 is conducting current to the output load through the bridge rectifier diodes. The secondary winding voltage is therefore the output voltage value. The primary winding voltages and also the voltage across the off switch are determined by the turns ratio of the transformer and the secondary winding voltage. The secondary center tap voltage during this time will be about ½ the output voltage. This voltage value will be slightly lower than the clamp capacitor voltage. This condition forces current to be drawn out of the clamp capacitor 43 through inductor 54 and resistor 55 in FIG. 2. This current flows into the secondary winding center tap. Through auto-transformer action this center tap current flows through the bridge rectifier diodes to the load and back to the clamp capacitor 43 which discharges the capacitor. The inductor 54 causes the current to be drawn out of the clamp capacitor smoothly instead of in the form of large spikes. The diode 56 across the clamp choke 54 provides a path for the choke current to flow when the clamp capacitor is not discharging. The resistor 55 is an impedance to limit surge current when the DC input voltage is first applied.

At the end of each conduction overlap period when one of the FET switches turns off, and voltages are developed across the transformer, spike voltages will appear across the FETs that are greater than the predicted peak values. These spikes are generated by the energy stored in the transformer leakage and wiring inductances. Diodes 44 and 45 and capacitor 43 provide a path for current flow when the FETs are turned off. The current that flows through these components only lasts for the time that it takes for the secondary current to build up to its normal value (i.e. input inductor current times Np/Ns). The leakage inductance determines this time. The clamp capacitor 43 prevents the voltage across the FETs from going too high during the time that current is flowing into it.

A discharge path for the clamp capacitor must be established for the voltage across the clamp capacitor (and FET's), or this voltage will rise to an unacceptable value. One method of accomplishing this is to simply connect the top of the clamp capacitor to the output voltage, as in FIG. 3. This is an energy return means to the secondary circuit. This approach limits the maximum clamp voltage to the output voltage. This voltage magnitude may be too high for many applications. If the clamp capacitor is connected to the secondary center tap, as in FIG. 2, then current will be discharged to the output whenever the secondary winding is clamped to the output. Current will flow through the secondary winding by auto transformer action as long as the secondary current is higher than ½ the clamp current. Inductor 54 (reference FIG. 2) controls the flow of current to the secondary center tap when the secondary winding is clamped to the output and the clamp capacitor is discharging. The bypass or protective diode 56, across the clamp inductor 54, provides a path for the inductor current to flow when the secondary winding is not clamped to the output and the clamp capacitor is not discharging. The resistor 55 in series with the center tap serves to limit the start up surge or inrush current through the clamp circuit when input voltage is first applied to the power supply during initial turn on.

The following waveforms illustrate the operation of the power circuit during the steady state operation that was previously discussed.

Figure 4:
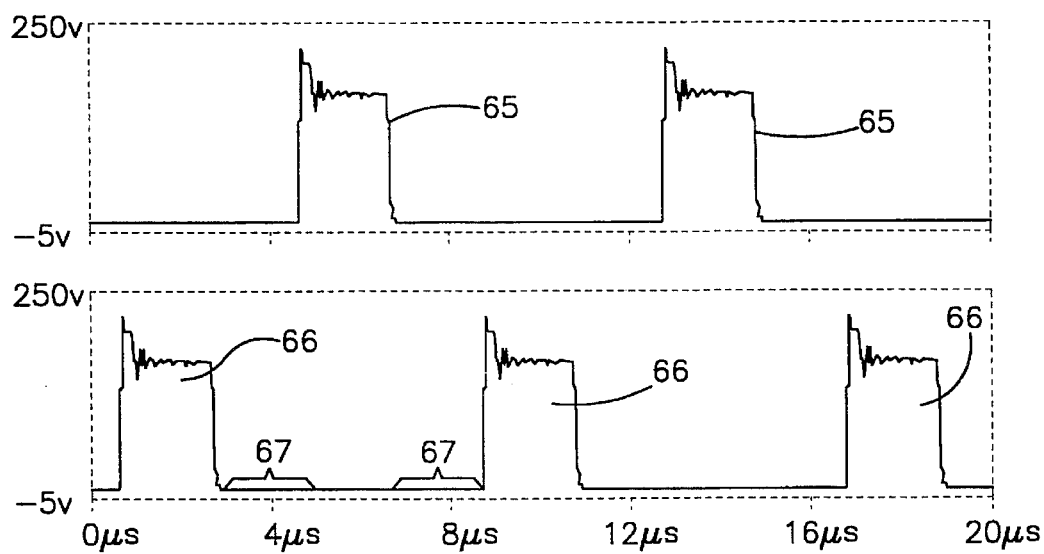
FIG. 4 is a wave form diagram of voltages across the switches.

FIG. 4 illustrates the wave forms of the voltages across switches 34 and 35. One will note that the voltages are clamped at about 200 volts. The voltage humps 65 occur when the switch 34 is off so that there is a voltage across this switch. The humps 66 occur when the switch 35 is off. The practically zero voltage areas 67 occur when both switches 34 and 35 are on.

Figure 5:
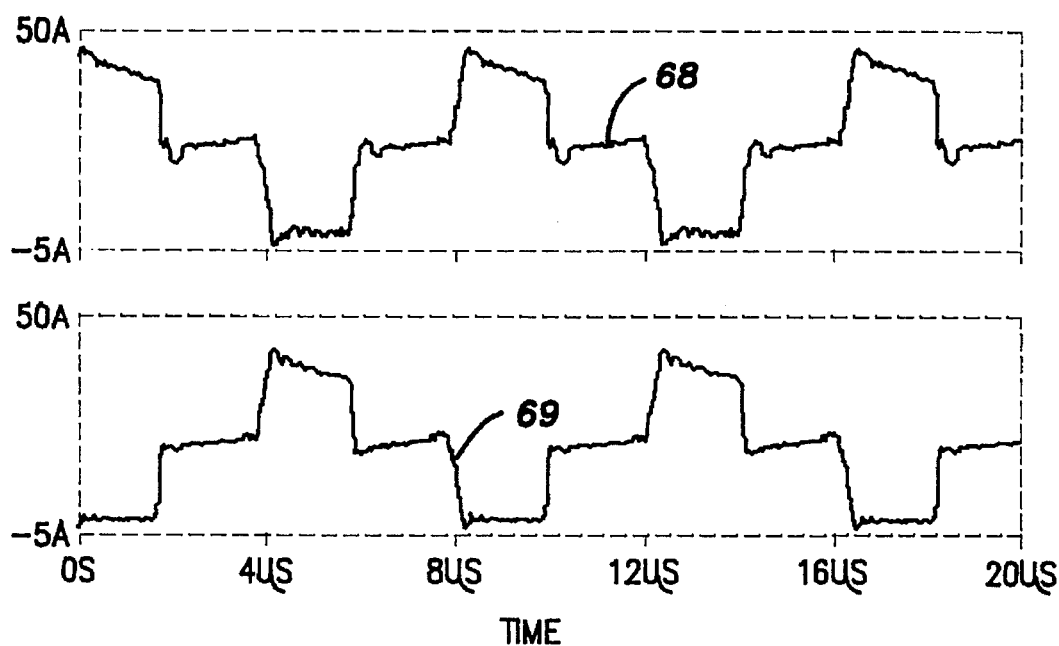
FIG. 5 is a wave form diagram of primary winding currents through the switches.

FIG. 5 shows wave forms 68 of the primary winding current through switch 34 and wave form 69 shows the primary winding current through switch 35. Note that the currents drop to about one half the peak value when both switches are on.

Figure 6:
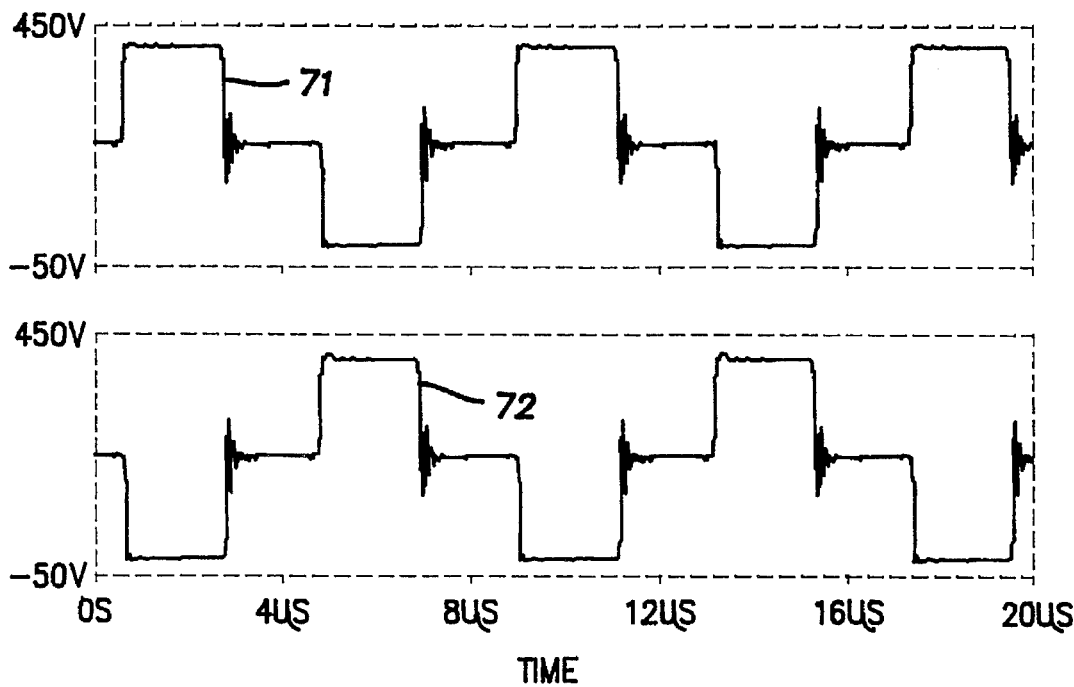
FIG. 6 is a wave form diagram of the voltages on the secondary winding.

FIG. 6 shows wave forms 71 and 72 of the secondary voltages taken from each end of the secondary winding to common. Note how the secondary winding voltages are clamped to output voltage of about 400 volts.

Figure 7:
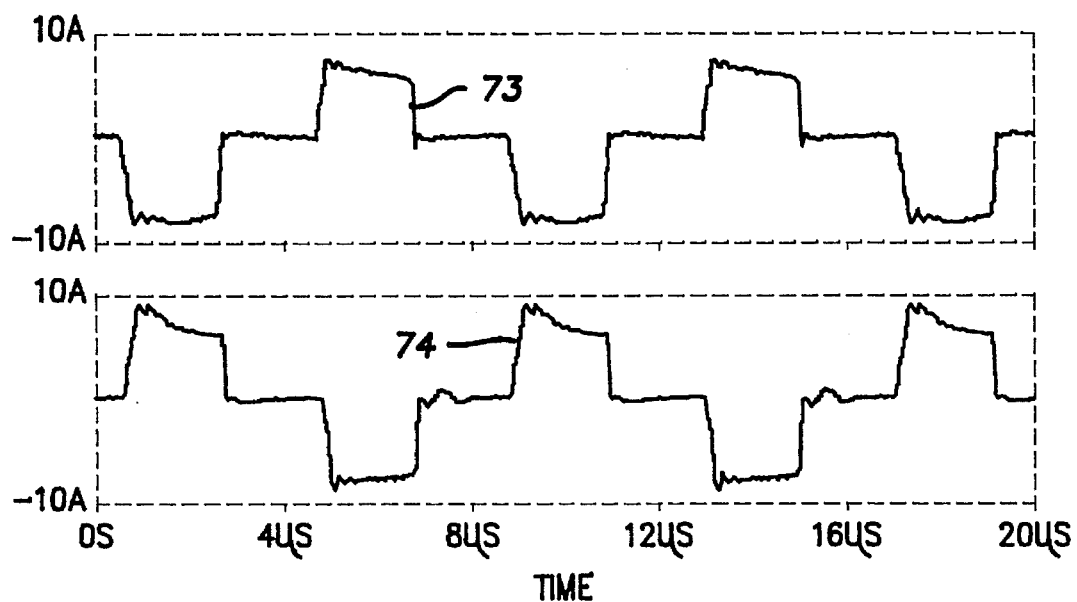
FIG. 7 is a wave form diagram of the secondary winding currents.

FIG. 7 shows a wave forms 73 and 74 of the secondary winding currents. These wave forms depict the currents measured at each end of the secondary winding.

Figure 8:
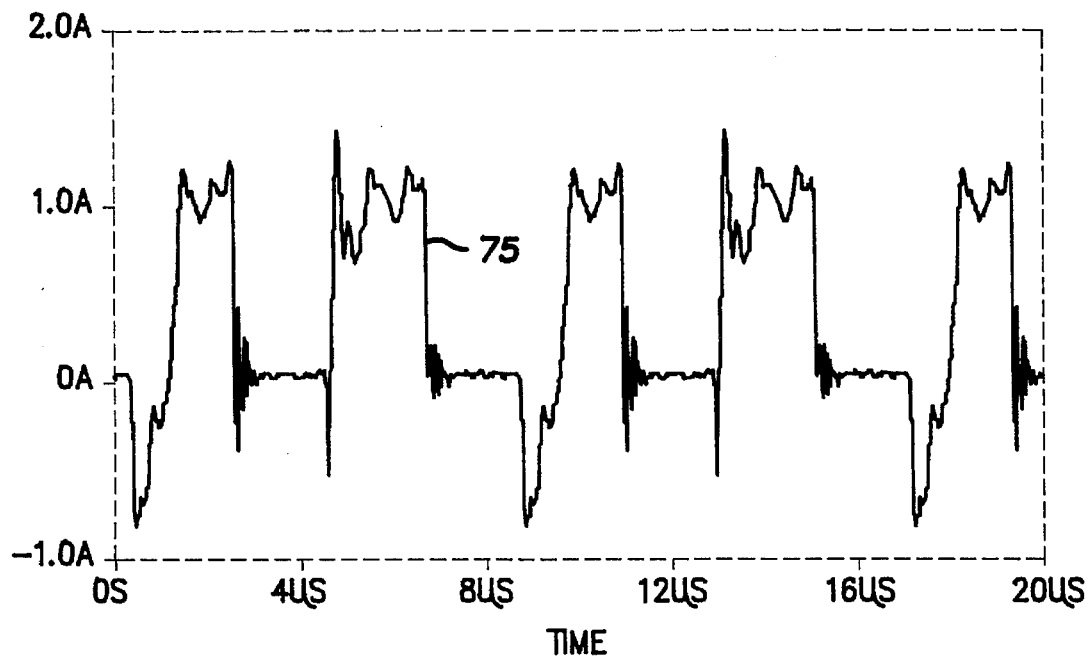
FIG. 8 is a wave form diagram of the secondary center tap current.

FIG. 8 shows the wave form 75 of the current flowing into the secondary center tap. It is also the current that is discharging the clamp capacitor 43.

Figure 9:
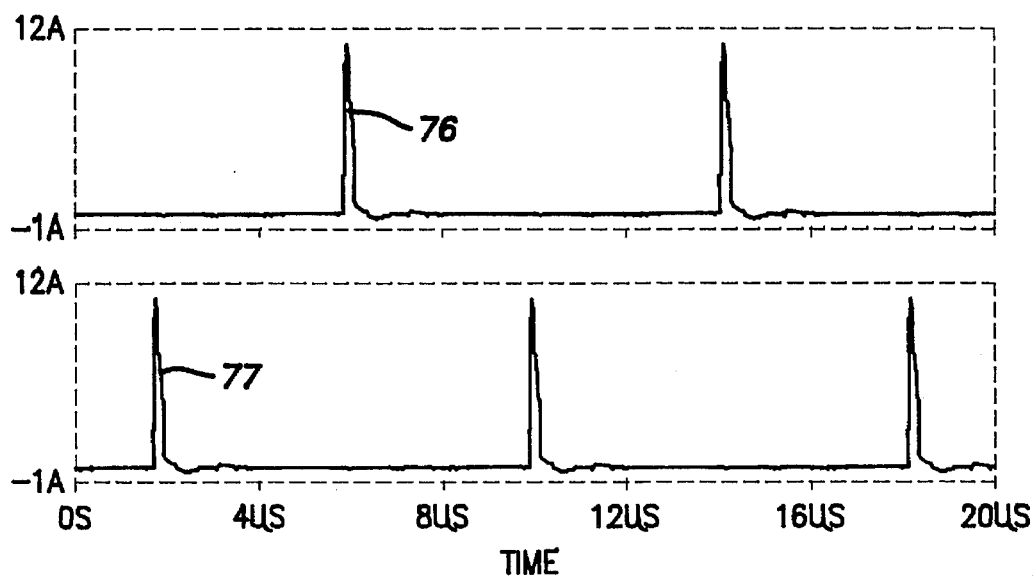
FIG. 9 is a wave form diagram of the current through the clamp diodes.

FIG. 9 illustrates wave forms 76 and 77 of the current flowing through the diodes 44 and 45 respectively. It is also the current flowing into and charging the clamp capacitor 43.

Figure 10:
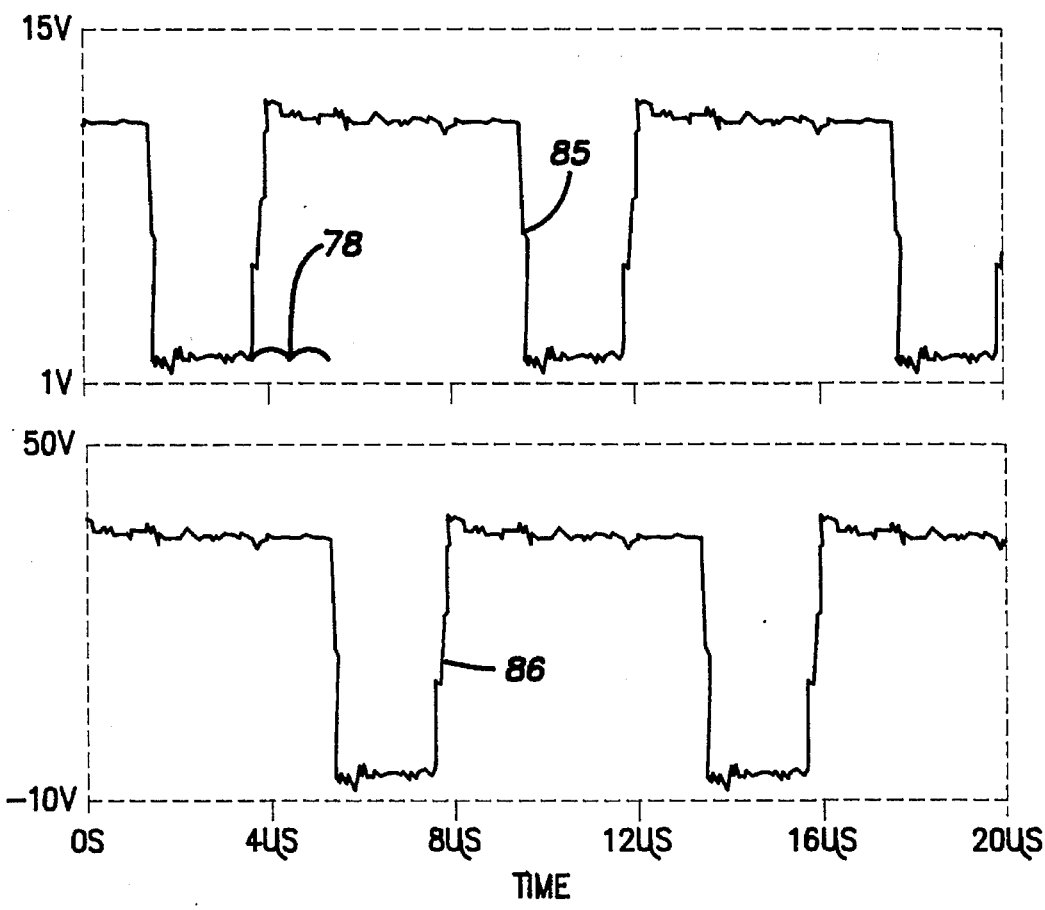
FIG. 10 is the control circuit gate drive wave forms on the switches.

FIG. 10 shows the wave forms 85 and 86 of the gate drive of the switches 34 and 35 respectively. These gate drives show the overlap condition in the area 78.

Figure 11:
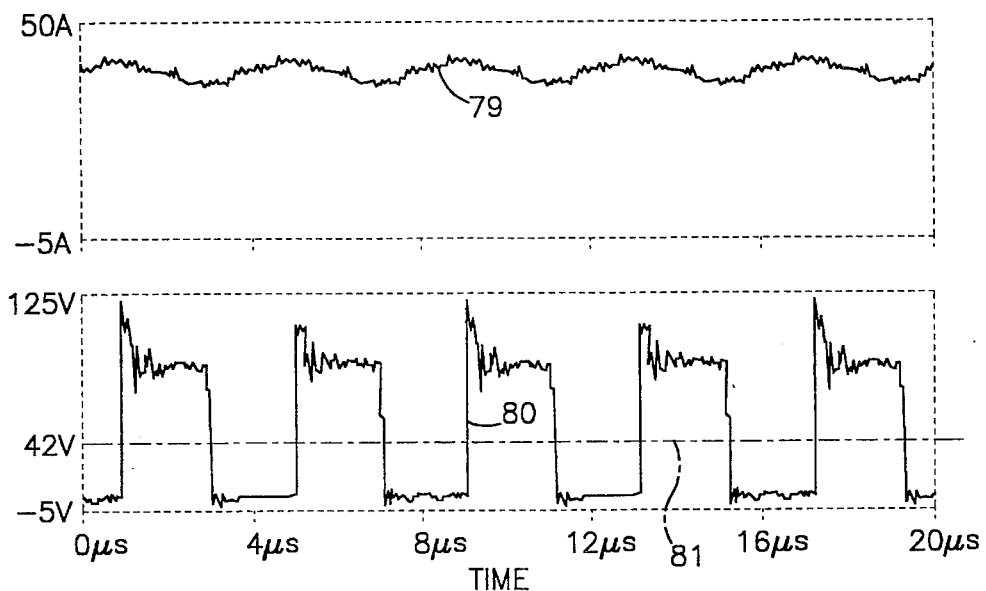
FIG. 11 is wave form diagrams of the primary center tap voltage and the input choke current.

FIG. 11 shows a wave form 79 of the input choke current which is primarily DC with a small amount of AC ripple. The primary center tap voltage is shown in wave form 80 that it goes higher than the input voltage, which is the reference line 81 through the middle of the voltage trace.

Figure 12:
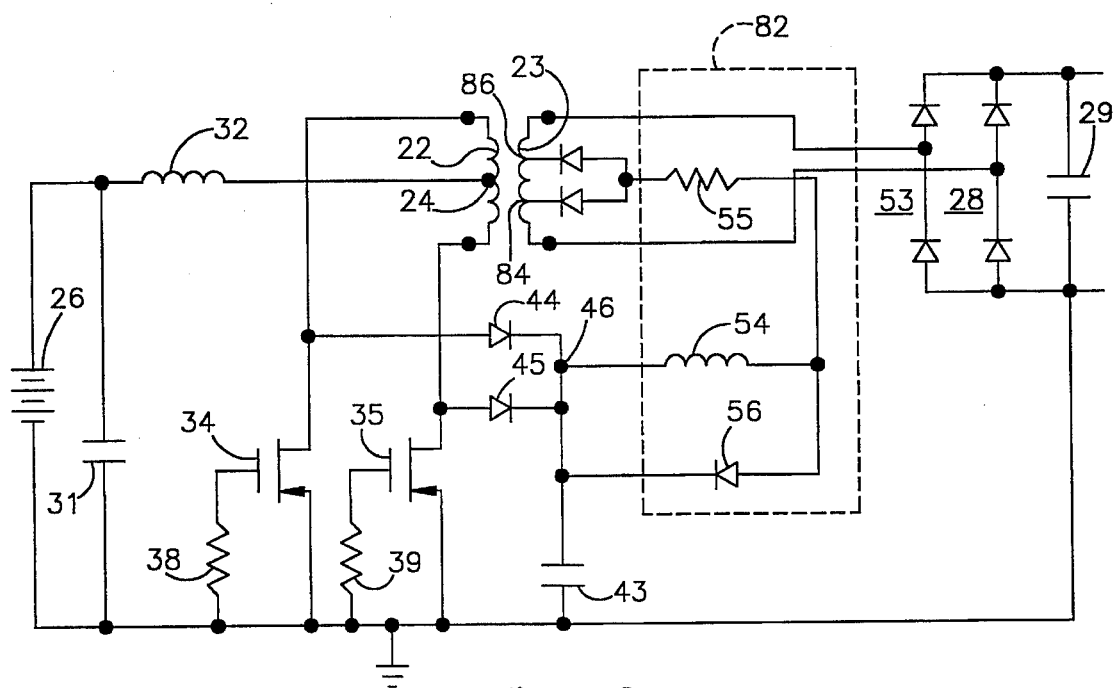
FIG. 12 is a schematic diagram of a second modification.

FIG. 12 is a schematic diagram of another clamp circuit 82 wherein the connection of the clamp circuit to the secondary winding is not at a mid-tap, but at two equally spaced points 83 and 84 from the ends of secondary 23. This achieves a lower clamping voltage if desired. The operation of the clamp circuit is basically the same but now the clamp capacitor 43 will be discharged to a lower voltage as determined by the turns ratio of the secondary taps 83 and 84.

Figure 13:
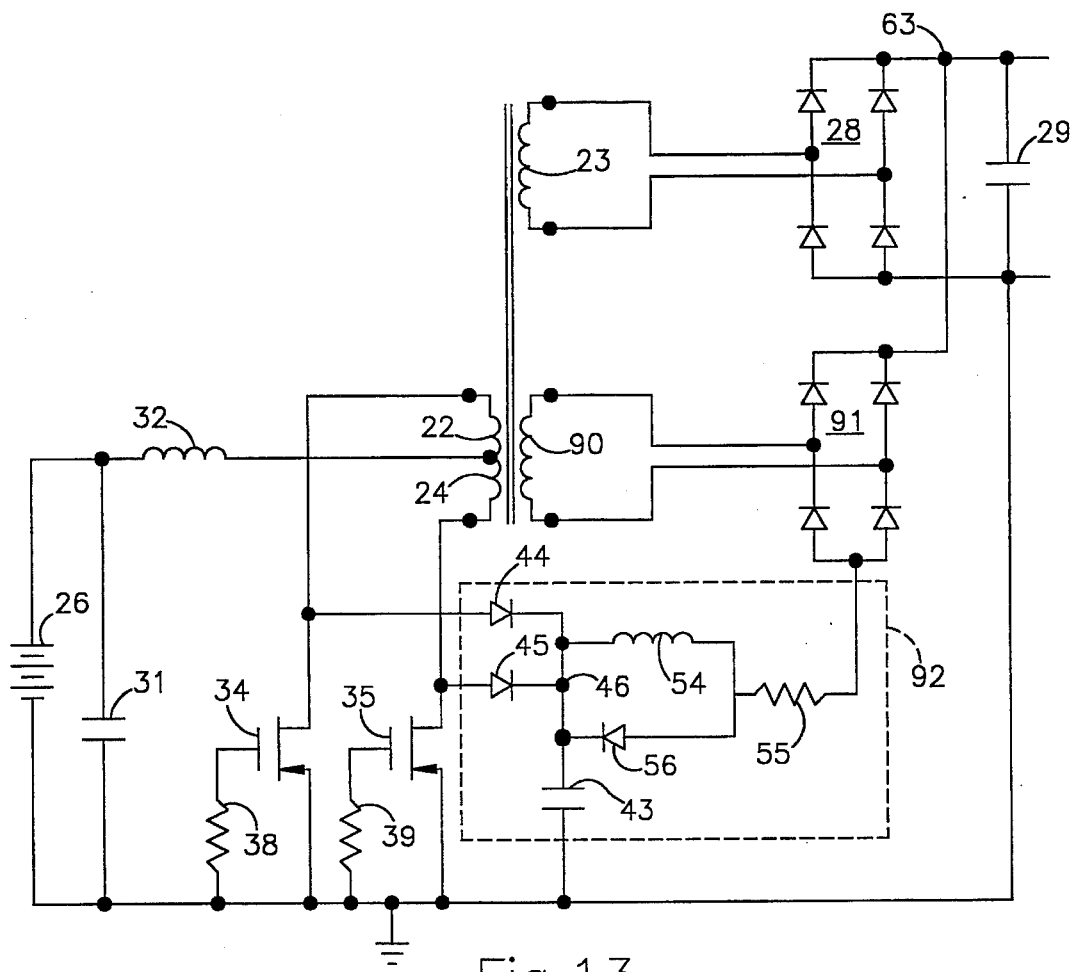
FIG. 13 is a schematic diagram of a third modification of the invention.

FIG. 13 is a third modification which utilizes an auxiliary winding 90 with an additional bridge rectifier 91 connected to the positive output terminal. The clamp circuit 92 is connected to the negative of this auxiliary winding. The auxiliary winding turns ratio can be adjusted to allow clamping voltages that are higher or lower than the original circuit of FIG. 2.

ANALYSIS:

The following equations describe the important parameters for design analysis purposes: They were derived under steady state conditions for continuous boost mode operation using math cad.

Variable definitions:

| | |
|---|---|
| $V_o := 395$ | output voltage |
| $V_d := 1.5$ | diode drop voltage for all diodes |
| $M := 5$ | step up transformer turns ratio, total secondary to ½ primary. |
| $L := 10 \cdot 10^{-6}$ | inductance of input inductor |
| $V_{in} := 38, 40 \ldots 72$ | input voltage range values |
| $P_{in} := 1500$ | assumed input power |
| $R_c := .01$ | input choke winding resistance |
| $R_t := .03$ | resistance of ½ of the transformer primary |
| $C_{in} := 5 \cdot 10^{-6}$ | input filter capacitance |
| $F_s := 250 \cdot 10^3$ | switching frequency at rectifier output (ie. 2xFET freq.) |
| $L_e := 5 \cdot 10^{-6}$ | leakage inductance as measured from total secondary to total primary windings |
| $R_{clp} := 1$ | resistance of clamp resistor |
| $C := 2 \cdot 10^{-6}$ | capacitance of clamp capacitor |
| $R_d := .03$ | on resistance of Fets M1 and M2. There are 8 FETs used, 4 in parallel for each M1 and M2. Each FET is rated at 300 volts, 40 amps and .12 ohms $R_{DS(ON)}$ @ 100 deg C. IXTH4N30 from IXYScorp. |
| $C_{oss} := 1350 \cdot 10^{-12}$ | FET junction output capacitance for 4 parallel devices |
| $E(I_{in}) =$ | Efficiency |

Basic equations—continuous mode boost operation $$D(V_{in}) = \frac{\frac{V_o}{M} + 2 \cdot \frac{V_d}{M} + \frac{L_e \cdot P_{in} \cdot F_s}{V_{in} \cdot M^2} + \frac{P_{in}}{V_{in}} \cdot (R_t + R_c + R_d) - V_{in}}{\left[ \frac{V_o}{M} + 2 \cdot \frac{V_d}{M} + \frac{P_{in}}{2 \cdot V_{in}} \cdot (R_t + R_d) \right]} \quad \text{eq 1)}$$

Duty cycle as a function of input voltage Vin. Duty cycle defined as overlap time divided by switching frequency period.

$$V_{tap} := \frac{V_o + 2 \cdot V_d}{M} \quad \text{eq 2)}$$

peak value of voltage from primary center tap 24 to common 25 excluding voltage spikes and ringing $$V_{fet} := 2 V_{tap} \quad \text{eq 3)}$$

peak value of FET drain to source voltage of switch 33 or 34 excluding spikes and ringing $$I_{in}(V_{in}) := \frac{P_{in}}{V_{in}} \quad \text{dc input current} \quad \text{eq 4)}$$

$$I_{LPP}(V_{in}) := \left[ V_{in} - I_{in}(V_{in}) \cdot \left( R_c + \frac{R_t}{2} + \frac{R_d}{2} \right) \right] \cdot \frac{D(V_{in})}{L \cdot F_s} \quad \text{eq 5)}$$

peak to peak value of ac ripple current in input choke 32

$$\Delta V_{in}(V_{in}) := \frac{I_{LPP}(V_{in})}{8 C_{in} \cdot F_s} \quad \text{eq 6)}$$

peak to peak value of ac ripple voltage across input filter capacitor 31 assuming all choke 32 ac ripple current is bypassed through the input filter capacitor 31

$$I_{CINRMS}(V_{in}) := \frac{I_{LPP}(V_{in})}{2} \cdot \sqrt{\frac{1}{3}}$$

rms value of ripple current through input capacitor 31 assuming all choke ripple current flows in the input filter capacitor.

$$I_{FRMS}(V_{in}) := \frac{I_{in}(V_{in})}{2} \cdot \sqrt{2 - D(V_{in})} \quad \text{eq 8)}$$

rms value of current flowing through fets 34 or 35

$$P_{on}(V_{in}) := 2 \cdot R_d \cdot I_{FRMS}(V_{in})^2 \quad \text{eq 9)}$$

Total FET conduction "ON STATE" losses of both 34 and 35

$$P_s := \frac{V_{fet}^2 \cdot F_s C_{oss}}{2} \quad \text{eq 10)}$$

FET switching losses during the turn on and discharge of $C_{oss}$. (Turn off losses assumed to be zero)

$$P_t(V_{in}) := P_s + P_{on}(V_{in}) \quad \text{eq 11)}$$

total FET 34 and 35 losses $$P_e(V_{in}) := \frac{1}{2} \cdot L_e \cdot \left( \frac{I_{in}(V_{in})}{M} \right)^2 \cdot F_s \quad \text{eq 12)}$$

power associated with leakage inductance trapped energy $$P_o(V_{in}) := \frac{I_{in}(V_{in})}{M} \cdot (1 - D(V_{in})) \cdot V_o + P_e(V_{in}) \quad \text{eq 13)}$$ output power $$E(V_{in}) := \frac{P_o(V_{in})}{P_{in}} \quad \text{overall efficiency} \quad \text{eq 14)}$$

$$I_o(V_{in}) := \frac{P_o(V_{in})}{V_o} \quad \text{average output current} \quad \text{eq 15)}$$

$$I_{PK}(V_{in}) := \frac{I_o(V_{in})}{1 - D(V_{in})} \quad \text{secondary 23 peak current} \quad \text{eq 16)}$$

$$I_{SRMS}(V_{in}) := I_{PK}(V_{in}) \cdot \sqrt{1 - D(V_{in})} \quad \text{eq 17)}$$

secondary 23 rms current $$I_{CORMS}(V_{in}) := \sqrt{I_{SRMS}(V_{in})^2 - I_o(V_{in})^2} \quad \text{eq 18)}$$

output capacitor 29 rms current $$P_{RD}(V_{in}) := I_{PK}(V_{in}) \cdot 2 \cdot V_d \cdot (1 - D(V_{in})) \quad \text{eq 19)}$$

total output rectifier 28 diode losses $$V_1(V_{in}) := V_d \cdot \frac{D(V_{in})}{1 - D(V_{in})} + \frac{V_o}{2} \quad \text{eq 20)}$$

clamp capacitor 43 voltage if Rclp 55 were equal to zero $$V_{clp}(V_{in}) := \frac{V_1(V_{in}) + V_{fet}}{2} + \left( \frac{V_1(V_{in}) - V_{fet}}{2} \right) \cdot$$

$$\sqrt{1 + \left( \frac{R_{clp} P_e(V_{in})}{1 - D(V_{in})} \right) \cdot \left( \frac{2}{V_1(V_{in}) - V_{fet}} \right)^2} \quad \text{eq 21)}$$

total clamp capacitor 43 voltage $$T_d(V_{in}) := \frac{2 \cdot L_e \cdot I_{in}(V_{in}) \cdot 10^6}{M^2 \cdot (V_{clp}(V_{in}) - V_{fet})} \quad \text{eq 22)}$$

leakage inductance delay time in microseconds $$I_{clp}(V_{in}) := \frac{I_{in}(V_{in})}{4} \cdot T_d(V_{in}) \cdot F_s \cdot 10^{-6} \quad \text{eq 23)}$$

average clamp current $$I_{cpk}(V_{in}) := \frac{I_{clp}(V_{in})}{1 - D(V_{in})} \quad \text{peak clamp current} \quad \text{eq 24)}$$

$$I_{clprms}(V_{in}) := I_{cpk}(V_{in}) \cdot \sqrt{1 - D(V_{in})} \quad \text{rms clamp current} \quad \text{eq 25)}$$

$$I_{caprms}(V_{in}) := \sqrt{\left( \frac{I_{in}(V_{in})}{2} \right)^2 \cdot T_d(V_{in}) \cdot 10^{-6} \cdot \frac{F_s}{3} - I_{clp}(V_{in})^2} \quad \text{eq 26)}$$

rms current in clamp capacitor 43

$$P_{rclp}(V_{in}) := I_{clprms}(V_{in})^2 \cdot R_{clp} \quad \text{eq 27)}$$

clamp resistor 55 power dissipation $$P_{dclp}(V_{in}) := I_{cpk}(V_{in}) \cdot V_d \cdot D(V_{in}) \quad \text{eq 28)}$$

dissipation of diode 56 across clamp choke 54

$$P_{drclp}(V_{in}) := \frac{I_{in}(V_{in})}{4} \cdot T_d(V_{in}) \cdot F_s \cdot V_d \cdot 10^{-6} \quad \text{eq 29)}$$

dissipation of clamp diodes 44 and 45

$$\Delta V_{clp}(V_{in}) := \frac{I_{in}(V_{in})}{4} \cdot \frac{T_d(V_{in}) \cdot 10^{-6}}{C} \quad \text{eq 30)}$$

ripple voltage on clamp capacitor 43

CALCULATIONS:
The following calculations are for the equations described above at 395 volts output, 1500 watts input, and 38 to 72 volts dc input voltage.
Vtap = 79.6     Vfet = 159.2     Ps = 4.277

| $V_{in}$ | $D(V_{in})$ | $I_{in}(V_{in})$ | $I_{LPP}(V_{in})$ | $\Delta V_{in}(V_{in})$ | $I_{CINRMS}(V_{in})$ | $I_{FRMS}(V_{in})$ | $P_{on}(V_{in})$ | $P_t(V_{in})$ |
|---|---|---|---|---|---|---|---|---|
| 38 | 0.574 | 39.474 | 8.3566 | 0.836 | 2.412 | 23.572 | 33.339 | 37.616 |
| 40 | 0.546 | 37.5 | 8.413 | 0.841 | 2.429 | 22.607 | 30.664 | 34.941 |
| 42 | 0.519 | 35.714 | 8.426 | 0.843 | 2.432 | 21.73 | 28.331 | 32.608 |
| 44 | 0.492 | 34.091 | 8.396 | 0.84 | 2.424 | 20.93 | 26.283 | 30.56 |
| 46 | 0.466 | 32.609 | 8.323 | 0.832 | 2.403 | 20.197 | 24.474 | 28.751 |
| 48 | 0.439 | 31.25 | 8.208 | 0.821 | 2.369 | 19.522 | 22.867 | 27.144 |
| 50 | 0.412 | 30 | 8.05 | 0.805 | 2.324 | 18.9 | 21.432 | 25.709 |
| 52 | 0.386 | 28.846 | 7.851 | 0.785 | 2.266 | 18.323 | 20.145 | 24.422 |
| 54 | 0.36 | 27.778 | 7.61 | 0.761 | 2.197 | 17.788 | 18.985 | 23.262 |
| 56 | 0.333 | 26.786 | 7.327 | 0.733 | 2.115 | 17.289 | 17.935 | 22.212 |
| 58 | 0.307 | 25.862 | 7.003 | 0.7 | 2.022 | 16.824 | 16.982 | 21.259 |
| 60 | 0.281 | 25 | 6.638 | 0.664 | 1.916 | 16.388 | 16.113 | 20.39 |
| 62 | 0.255 | 24.194 | 6.231 | 0.623 | 1.799 | 15.979 | 15.319 | 19.596 |
| 64 | 0.229 | 23.438 | 5.784 | 0.578 | 1.67 | 15.594 | 14.59 | 18.867 |

CALCULATIONS:

The following calculations are for the equations described above at 395 volts output, 1500 watts input, and 38 to 72 volts dc input voltage.

Vtap = 79.6    Vfet = 159.2    Ps = 4.277

| 66 | 0.203 | 22.727 | 5.295 | 0.53  | 1.529 | 15.232 | 13.92  | 18.197 |
| 68 | 0.179 | 22.059 | 4.766 | 0.477 | 1.376 | 14.89  | 13.302 | 17.579 |
| 70 | 0.152 | 21.429 | 4.195 | 0.42  | 1.211 | 14.566 | 12.731 | 17.008 |
| 72 | 0.126 | 20.833 | 3.584 | 0.358 | 1.035 | 14.26  | 12.201 | 16.478 |

| $V_{in}$ | $P_c(V_{in})$ | $V_{clp}(V_{in})$ | $I_{clp}(V_{in})$ | $I_{clprms}(V_{in})$ | $I_{cpk}(V_{in})$ | $I_{caprms}(V_{in})$ | $P_{rclp}(V_{in})$ | $P_{dclp}(V_{in})$ | $P_{RD}(V_{in})$ |
|---|---|---|---|---|---|---|---|---|---|
| 38 | 38.954 | 201.67 | 0.917 | 1.405 | 2.151 | 3.351 | 1.973 | 1.851 | 10.395 |
| 40 | 35.156 | 201.15 | 0.838 | 1.244 | 1.847 | 3.126 | 1.548 | 1.514 | 10.475 |
| 42 | 31.888 | 200.72 | 0.768 | 1.108 | 1.598 | 2.925 | 1.227 | 1.244 | 10.545 |
| 44 | 29.055 | 200.35 | 0.706 | 0.991 | 1.391 | 2.743 | 0.982 | 1.027 | 10.605 |
| 46 | 26.583 | 200.02 | 0.651 | 0891  | 1.218 | 2.579 | 0.793 | 0.851 | 10.659 |
| 48 | 24.414 | 199.75 | 0.602 | 0.804 | 1.073 | 2.431 | 0.646 | 0.707 | 10.706 |
| 50 | 22.5   | 199.5  | 0.558 | 0.728 | 0.95  | 2.296 | 0.53  | 0.588 | 10.747 |
| 52 | 20.803 | 199.29 | 0.519 | 0.662 | 0.845 | 2.173 | 0.439 | 0.489 | 10.785 |
| 54 | 19.29  | 199.1  | 0.483 | 0.604 | 0.755 | 2.06  | 0.365 | 0.407 | 10.818 |
| 56 | 17.937 | 198.93 | 0.451 | 0.553 | 0.677 | 1.956 | 0.306 | 0.339 | 10.848 |
| 58 | 16.721 | 198.78 | 0.423 | 0.508 | 0.61  | 1.861 | 0.258 | 0.281 | 10.875 |
| 60 | 15.625 | 198.64 | 0.396 | 0.467 | 0.551 | 1.773 | 0.218 | 0.233 | 10.9   |
| 62 | 14.633 | 198.51 | 0.372 | 0.431 | 0.5   | 1.692 | 0.186 | 0.191 | 10.922 |
| 64 | 13.733 | 198.4  | 0.35  | 0.399 | 0.455 | 1.617 | 0.159 | 0.156 | 10.942 |
| 66 | 12.913 | 198.3  | 0.33  | 0.37  | 0.415 | 1.547 | 0.137 | 0.126 | 10.961 |
| 68 | 12.165 | 198.2  | 0.312 | 0.344 | 0.379 | 1.482 | 0.118 | 0.101 | 10.978 |
| 70 | 11.48  | 198.12 | 0.295 | 0.32  | 0.348 | 1.421 | 0.103 | 0.079 | 10.994 |
| 72 | 10.851 | 198.04 | 0.279 | 0.299 | 0.32  | 1.365 | 0.089 | 0.06  | 11.009 |

| $V_{in}$ | $T_d(V_{in})$ | $P_{dclp}(V_{in})$ | $\Delta V_{clp}(V_{in})$ | $I_{PK}(V_{in})$ | $I_{SRMS}(V_{in})$ | $I_o(V_{in})$ | $P_o(V_{in})$ | $E(V_{in})$ | $I_{CORMS}(V_{in})$ |
|---|---|---|---|---|---|---|---|---|---|
| 38 | 0.372 | 1.851 | 1.834 | 8.126 | 5.306 | 3.465 | 1368.69 | 0.912 | 4.019 |
| 40 | 0.358 | 1.514 | 1.676 | 7.696 | 5.184 | 3.492 | 1379.24 | 0.919 | 3.832 |
| 42 | 0.344 | 1.244 | 1.536 | 7.311 | 5.069 | 3.515 | 1388.39 | 0.926 | 3.653 |
| 44 | 0.331 | 1.027 | 1.412 | 6.963 | 4.961 | 3.535 | 1396.37 | 0.931 | 3.481 |
| 46 | 0.319 | 0.851 | 1.302 | 6.648 | 4.86  | 3.553 | 1403.38 | 0.936 | 3.316 |
| 48 | 0.308 | 0.707 | 1.204 | 6.36  | 4.764 | 3.569 | 1490.57 | 0.94  | 3.156 |
| 50 | 0.298 | 0.588 | 1.117 | 6.097 | 4.674 | 3.582 | 1415.06 | 0.943 | 3.001 |
| 52 | 0.288 | 0.489 | 1.038 | 5.855 | 4.588 | 3.595 | 1419.96 | 0.947 | 2.85  |
| 54 | 0.278 | 0.407 | 0.967 | 5.632 | 4.506 | 3.606 | 1424.35 | 0.95  | 2.703 |
| 56 | 0.27  | 0.339 | 0.903 | 5.425 | 4.429 | 3.616 | 1428.31 | 0.952 | 2.558 |
| 58 | 0.261 | 0.281 | 0.845 | 5.234 | 4.356 | 3.625 | 1431.88 | 0.955 | 2.415 |
| 60 | 0.254 | 0.233 | 0.792 | 5.055 | 4.286 | 3.633 | 1435.12 | 0.957 | 2.273 |
| 62 | 0.246 | 0.191 | 0.744 | 4.888 | 4.219 | 3.641 | 1438.07 | 0.959 | 2.131 |
| 64 | 0.239 | 0.156 | 0.701 | 4.733 | 4.155 | 3.647 | 1440.76 | 0.961 | 1.989 |
| 66 | 0.233 | 0.126 | 0.661 | 4.586 | 4.094 | 3.654 | 1443.22 | 0.962 | 1.846 |
| 68 | 0.226 | 0.101 | 0.624 | 4.449 | 4.035 | 3.659 | 1445.48 | 0.964 | 1.7   |
| 70 | 0.22  | 0.079 | 0.59  | 4.32  | 3.979 | 3.665 | 1447.56 | 0.965 | 1.55  |
| 72 | 0.215 | 0.06  | 0.559 | 4.198 | 3.925 | 3.67  | 1449.48 | 0.966 | 1.393 |

Figure 14:
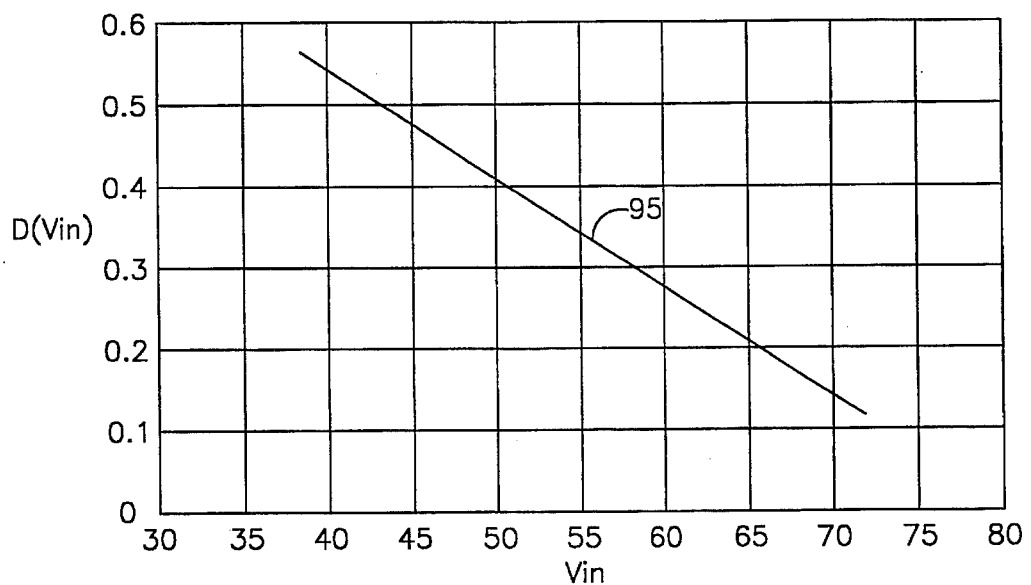
FIG. 14 is a graph of duty cycle D of the FET switches.
Figure 15:
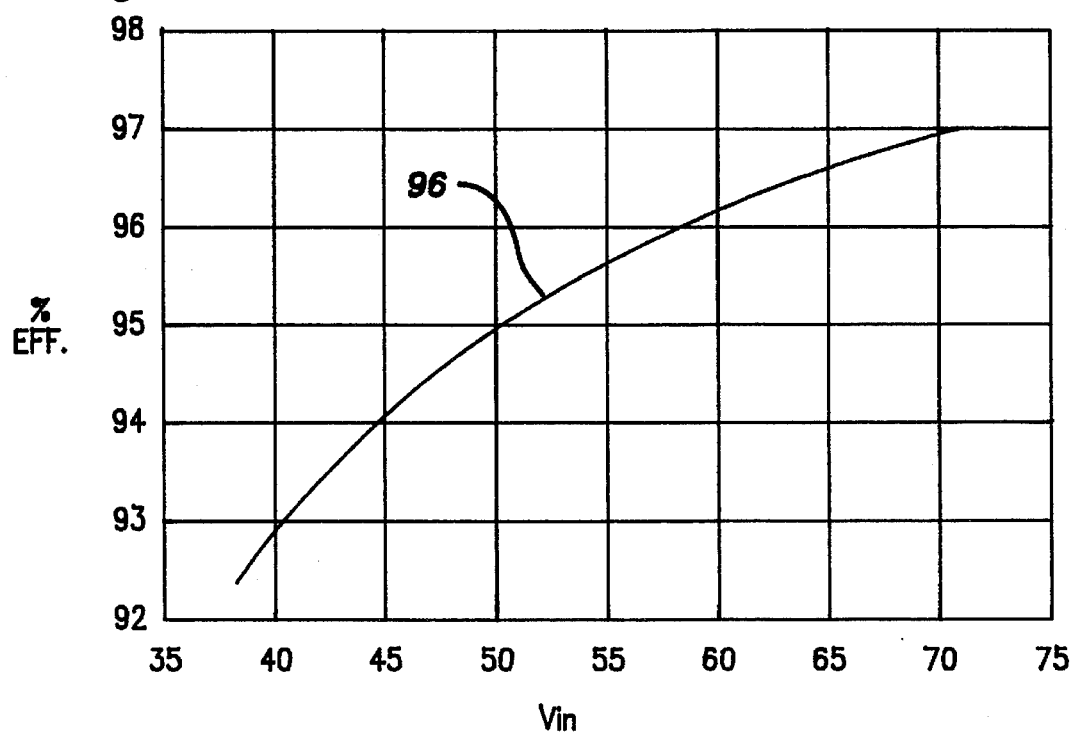
FIG. 15 is a graph of calculated efficiency as a function of input voltage.
Figure 16:
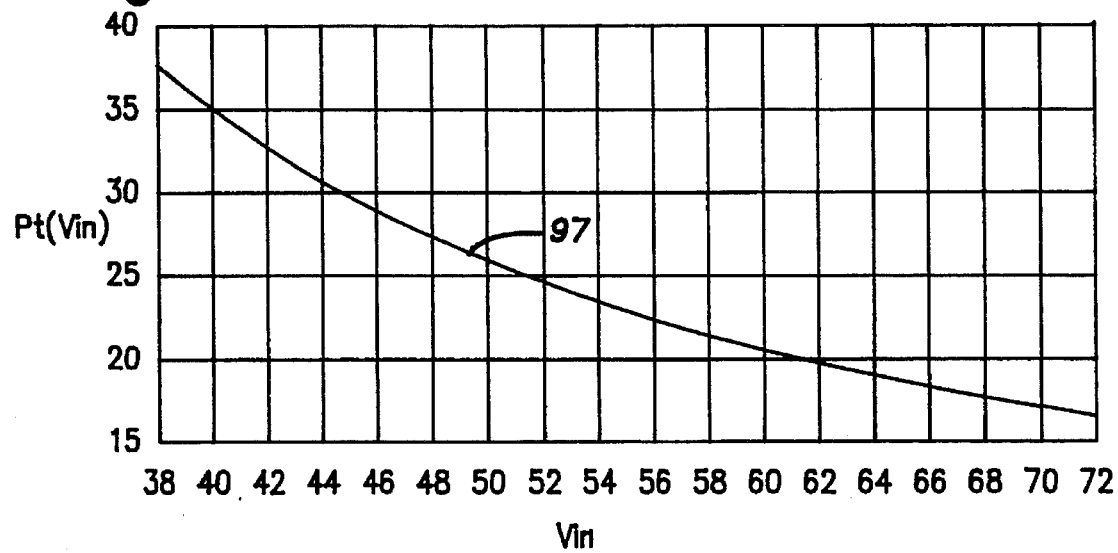
FIG. 16 is a graph of total power dissipation of the FET switches.
Figure 17:
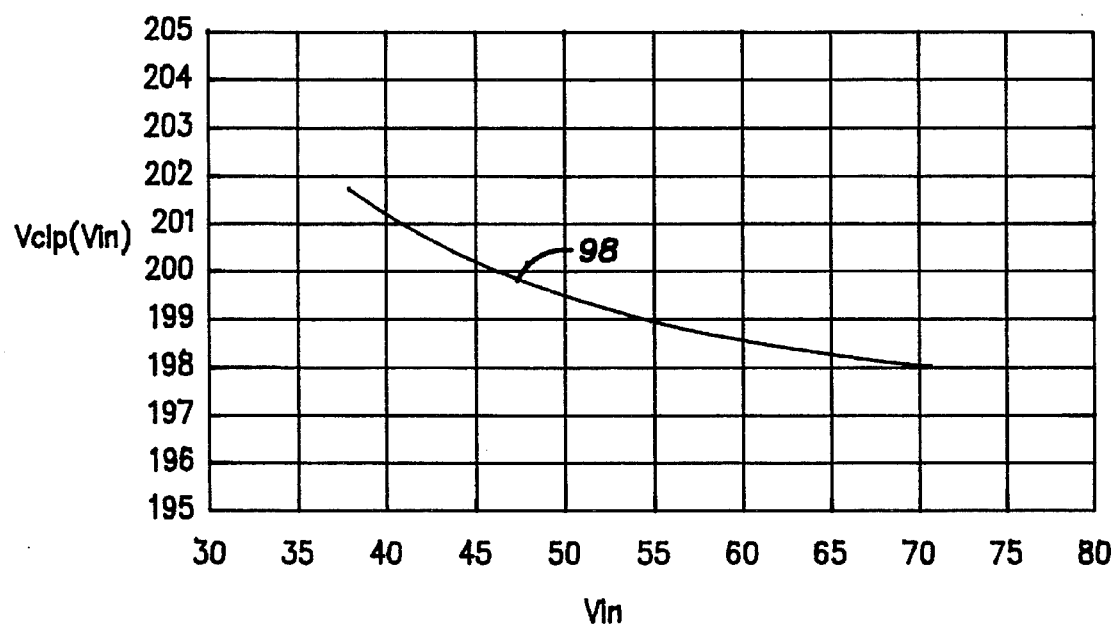
FIG. 17 is a graph of clamp capacitor voltage as a function of input voltage.

Some of the more important values from the charts of pages 15–17 may be graphed in FIGS. 14–17. FIG. 14 shows a curve 95 of the calculated duty cycle of the primary FET switches, and shows that it varies linearly. FIG. 15 shows a curve 96 of the calculated efficiency and shows that it increases as the input voltage increases. FIG. 16 shows a curve 97 of the total power dissipation of the FET switches. FIG. 17 shows a curve 98 of the clamp capacitor voltage as a function of input voltage.

What has been described above in the formulas and tables refers to a boost mode of operation. This is when for a certain portion of the duty cycle both FET switches 34 and 35 are conducting simultaneously.

A second mode of operation may be referred to as a buck mode. If both of the FET's are turned off for a portion of each half cycle, and then alternately, one FET at a time is turned on for the remainder of each half cycle, the output voltage may be sustained at values below the minimum boost mode voltage. This buck mode of operation is required to limit the in-rush current when the input voltage is first applied. The clamp circuit still functions and energy is transferred to the output from the clamp capacitor when one FET 34 or 35 is turned on. A third mode of operation exists for very low output voltages wherein the clamp capacitor voltage becomes equal to the output voltage instead of one half the output voltage. This is caused by the clamp circuit current that flows into the secondary center tap. During this third mode of operation the magnitude of the clamp current is greater than two times the input inductor current reflected through the secondary winding and this results in the transformer clamping to zero volts across all windings. This produces a form of boost operation even though the FET switches are being modulated in the buck mode. However, the output and clamp capacitor voltages can never be lower than the input voltage.

The following is a list of components of a circuit embodying the invention shown in FIG. 2 as a workable circuit.

| L32 | 10 μH |
| $L_{clp}$ 54 | 50 μH |
| $R_{38 \& 39}$ | 1K OHM |
| $R_{clp}$ 55 | 1 OHM |
| ALL DIODES | DMOD |
| $C_{in}$ 31 | 5 μfd |
| $C_{clp}$ 43 | 2 μfd |
| $C_o$ 29 | 1000 μfd |

It will be noted that the primary circuit and the secondary circuit are tied together at two points; one being the common ground at 25 and the other being the clamp voltage being applied in various ways to the secondary circuit. This is necessary in order that the energy stored in the clamp capacitor 43 is fed back to the output. This is a main advantage of the present circuit in that there is a very low loss, perhaps only 10% of a standard clamp circuit of FIG. 1 because in FIG. 1 the clamp capacitor 43 is tied back to the primary circuit, which produces high power dissipation in the clamp resistor 47. As a result one limitation of the circuit is that the primary and the secondary circuits can not be isolated, even though a transformer is used. Please note that there are eight FET switches, four in parallel as the switch 34 and four more in parallel as the FET switch 35. This is in order to achieve the 1400 watt output capacity.

The present disclosure includes that contained in the appended claims, as well as that of the foregoing description. Although this invention has been described in its preferred form with a certain degree of particularity, it is understood that the present disclosure of the preferred form has been made only by way of example and that numerous changes in the details of construction and the combination and arrangement of parts may be resorted to without departing from the spirit and the scope of the invention as hereinafter claimed.

What is claimed is:

1. A low-loss clamp circuit for a DC to DC converter, the converter including a transformer with a secondary winding in a secondary circuit and center tapped primary winding, the primary winding center tap and a circuit ground being energizable by a DC voltage input, rectifier connected to the secondary winding and to the circuit ground to supply a DC output voltage;

the said rectifier being a four diode bridge rectifier, and the converter being a current fed converter;

a pair of semiconductor switches each having input and output electrodes, each end of the primary winding being connected through a respective switch to circuit ground, each switch having a control electrode connected to a control circuit, said clamp circuit comprising:

a pair of diodes connected cathode-to-cathode across the primary winding of the switches at a clamp junction;

a clamp capacitor connected between said clamp junction and said circuit ground; and energy return means connected to said clamp junction to return energy from said clamp capacitor directly to said secondary circuit.

2. A clamp circuit as set forth in claim 1, including energy storage means connected in circuit with one of said primary and said secondary windings.

3. A clamp circuit as set forth in claim 2, wherein said energy storage means includes a capacitor in parallel with the DC input voltage.

4. A clamp circuit as set forth in claim 2, wherein said energy storage means includes an inductance in series with the DC input voltage.

5. A clamp circuit as set forth in claim 2, wherein said energy storage means is connected to be a filter of the input voltage.

6. A clamp circuit as set forth in claim 2, wherein said energy storage means is connected to be a load on said secondary winding.

7. A clamp circuit as set forth in claim 2, wherein said energy storage means is a capacitor connected effectively in parallel with said secondary winding.

8. A clamp circuit as set forth in claim 1, including a clamp impedance in circuit in said energy return means.

9. A clamp circuit as set forth in claim 8, including a clamp diode connected across said clamp impedance with the cathode thereof connected to said clamp junction.

10. A clamp circuit as set forth in claim 1, wherein said secondary winding has an effective center tap; and a clamp impedance has a connection to said secondary center tap.

11. A clamp circuit as set forth in claim 1, wherein said energy return means is connected to the positive output voltage terminal.

12. A clamp circuit as set forth in claim 1, wherein said energy return means is connected to taps which are symmetrically spaced relative to the ends of said secondary winding.

13. A clamp circuit as set forth in claim 12, wherein said clamp resistance is connected through separate diodes to said symmetrically spaced taps.

14. A clamp circuit as set forth in claim 1, including an auxiliary secondary winding on said transformer, and said energy return means being connected to the output of said auxiliary secondary winding.

15. A clamp circuit as set forth in claim 14, including an auxiliary rectifier connected to the output of said auxiliary secondary winding, and said auxiliary rectifier being connected in said energy return means.

* * * * *